United States Patent
Lunde et al.

(10) Patent No.: US 8,144,534 B2
(45) Date of Patent: Mar. 27, 2012

(54) METHODS AND MEMORY DEVICES FOR REPAIRING MEMORY CELLS

(75) Inventors: Aron Lunde, Boise, ID (US); Seth Eichmeyer, Boise, ID (US); Tim Cowles, Boise, ID (US); Patrick Mullarkey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 291 days.

(21) Appl. No.: 12/547,209

(22) Filed: Aug. 25, 2009

(65) Prior Publication Data
US 2011/0051538 A1    Mar. 3, 2011

(51) Int. Cl.
*G11C 29/00* (2006.01)
(52) U.S. Cl. .................................. 365/200; 365/230.03
(58) Field of Classification Search .................. 365/200, 365/230.06, 149
See application file for complete search history.

(56) References Cited

U.S. PATENT DOCUMENTS

| | | | |
|---|---|---|---|
| 5,293,348 A * | 3/1994 | Abe | 365/230.03 |
| 5,762,878 A | 6/1998 | Kablanian et al. | 395/182.05 |
| 6,181,614 B1 | 1/2001 | Aipperspach et al. | 365/200 |
| 2007/0140033 A1* | 6/2007 | Yang et al. | 365/225.5 |
| 2007/0283084 A1 | 12/2007 | Chiu et al. | 711/104 |
| 2008/0013366 A1* | 1/2008 | Shore | 365/149 |
| 2008/0091988 A1 | 4/2008 | Yoel et al. | 714/711 |

FOREIGN PATENT DOCUMENTS
CN    10/1090000 A    12/2007
* cited by examiner

*Primary Examiner* — Vu Le
(74) *Attorney, Agent, or Firm* — Dorsey & Whitney LLP (57) ABSTRACT

Methods and memory devices for repairing memory cells are discloses, such as a memory device that includes a main array having a plurality of sections of memory cells. One such main array includes a plurality of sets of input/output lines, each of which may be coupled to a respective plurality of memory cells in each section. One such memory device also includes a redundant section of memory cells, corresponding in number to the number of memory cells in each of the sections of the main array. An addressing circuit may contain a record of, for example, sections that have been determined to be defective. The addressing circuit may receive an address and compare the received address with the record of defective sections. In the event of a match, the addressing circuit may redirect an access to memory cells corresponding to the received address to memory cells in the redundant section.

25 Claims, 5 Drawing Sheets

METHODS AND MEMORY DEVICES FOR REPAIRING MEMORY CELLS

TECHNICAL FIELD

Embodiments of this invention relate to semiconductor memory devices, and, more particularly, to the repair of defective memory cells.

BACKGROUND OF THE INVENTION

Memory devices typically contain a large number of memory cells arranged in rows and columns. Although memory cells and other circuitry in memory devices are normally very reliable, the large number of memory cells in memory devices may result in a significant probability that there will be at least one defective memory cell in every memory device. To avoid the need to discard such memory devices as defective, techniques have been developed to repair memory cells, particularly as long as relatively few memory cells are defective. Memory cells are typically repaired on a row-by-row or a column-by-column basis in which a redundant row or column may be substituted for a row or column, respectively, containing one or more defective memory cells. The address of the defective row or column may then be recorded and compared to a row or column address associated with a received memory request (e.g., a request to write to or read from memory) to detect an access to a row or column that has been determined to include a defective memory cell (hereinafter "a defective memory cell"). The received address may then be redirected (e.g., re-mapped) to the address of the corresponding row or column of memory cells.

The above-described technique for repairing defective memory cells can be effective in salvaging memory devices as long as the number of rows or columns containing a defective memory cell does not exceed the number of redundant rows or columns provided in the memory device. However, there are usually an adequate number of redundant rows or columns as long as each defect in the memory device affects only a single row or column. A defect may make multiple rows or columns unusable if the defect occurs in a component of the memory device data path that affects multiple rows or columns. More specifically, memory cells are typically arranged in sections of memory cells, which are typically referred to, for example, as "arrays" or "blocks" and in some cases "banks." The memory cells in each section may be arranged in rows and columns. The memory cells in each column are usually coupled to either a respective digit line for that column or a respective pair of complementary digit lines for that column. A sense amplifier may be provided for each column of memory cells, and it may be connected by the digit line(s) to the memory cells in the respective column. All of the sense amplifiers for the section of memory cells are normally connected to one or more pairs of complementary input/output ("I/O") lines. Each pair of I/O lines may then be connected to a respective differential sense amplifier, which is sometimes also known as a "helper flip-flop." Therefore, a defect in a complementary pair of I/O lines, such as a short circuit between the I/O lines, or a defect in one of the differential sense amplifiers, can render the entire section of memory cells defective.

The number of rows and columns of memory cells in a typical section normally far exceeds the number of redundant rows and redundant columns in a memory device. Although the number of redundant rows and columns could, of course, be vastly increased, the amount of circuitry that would be needed to support such a large number of redundant rows and columns may be immense. For example, a typical section contains 2,048 columns of memory cells and 512 rows of memory cells. In practice, 8 columns are simultaneously addressed to simultaneously provide 8 bits of data, thus necessitating only 256 (2,048/8) column decoders but requiring 8 sets (e.g., pairs) of I/O lines.

To be able to use each of these redundant rows and columns, may require circuitry, such as an array of anti-fuses, to record the address of each defective row or column. Therefore, 768 (512+256) sets of anti-fuses or other address recording devices may be required to record the addresses in order to repair all of the rows and columns in a section. Also required would be 768 circuits for comparing the recorded addresses of defective rows and columns with received addresses. Therefore, the large amount of memory cells that are unusable when a defect occurs "downstream" from a row or column of memory cells, such as in a pair of I/O lines, makes repair of such defects impractical. As a result, memory devices containing such types of defects must normally be scrapped.

There is therefore a need for a technique to allow repair of the memory cells in an entire section, such as an array or block, without requiring an excessive amount of circuitry to support such repairs.

DETAILED DESCRIPTION

Figure 1:
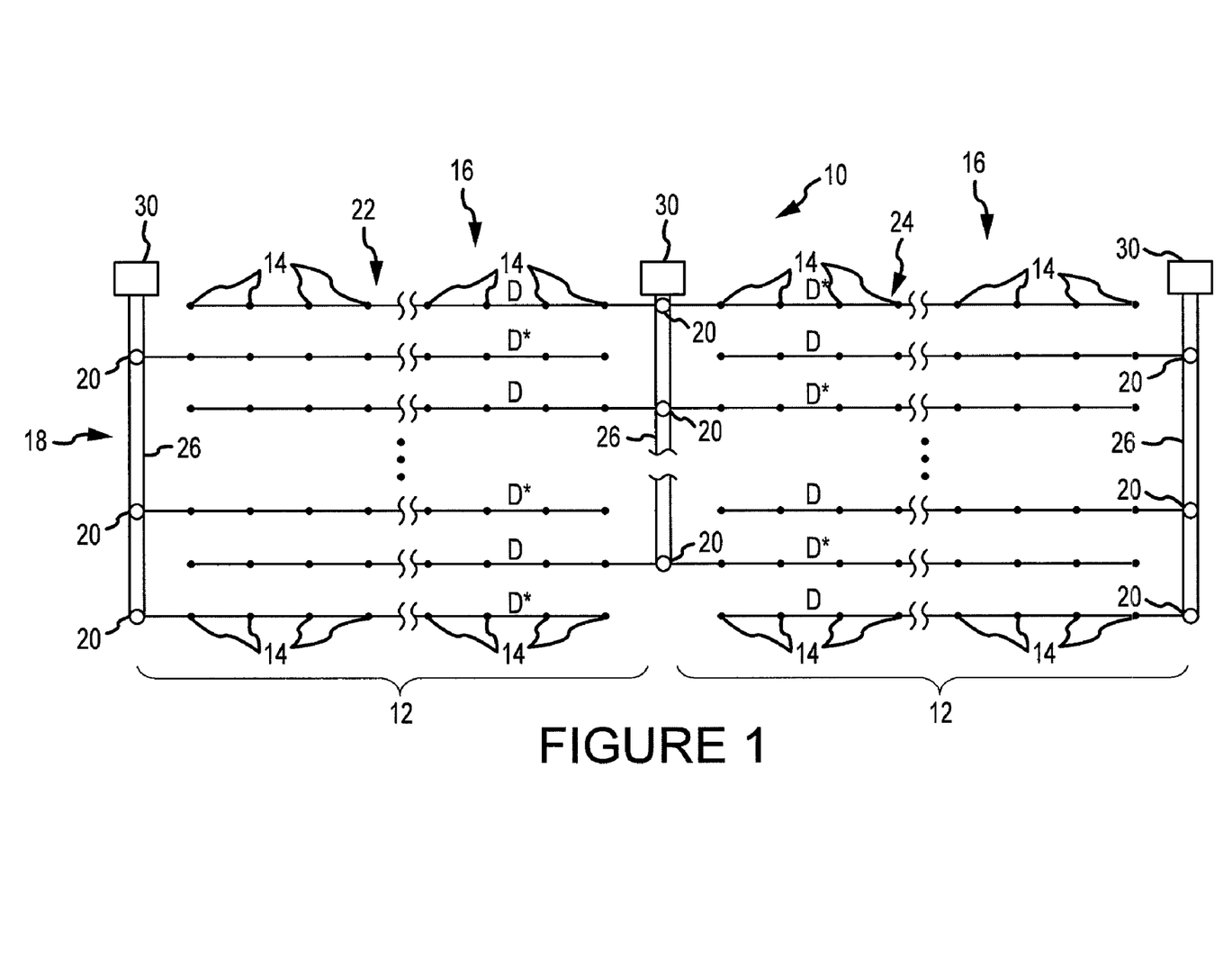
FIG. 1 is a schematic diagram of an embodiment of a section of memory cells according to an embodiment of the invention.

An embodiment of a portion of a memory device 10 is shown in FIG. 1. The memory device 10 includes two sections 12 of memory cells 14 that may be arranged in rows 16 and columns 18. The memory device 10 also includes a plurality of sense amplifiers 20 positioned between each section 12. One sense amplifier 20 may be provided for each column of memory cells 14. The architecture shown in FIG. 1 is for an "open-digit line" architecture in which each sense amplifier 20 is coupled to a digit line D or D* extending through one section 12 of memory cells 14 and to another digit line D or D* extending through an adjacent section 12 of memory cells 14. In practice, the rows that couple memory cells 14 to digit lines D that are coupled to one side of the sense amplifier 20 provide access to bits from the odd gap, while rows that couple memory cells 14 to digit lines D* that are coupled to the other side of the sense amplifier 20 provide access to bits from the odd gap. All of the sense amplifiers 20 between sections 22 and 24, for example, which are coupled to the digit lines D* in section 24 and to the digit lines D in section 22 may be connected to a respective pair of complementary I/O lines 26 that are also between the sections 22 and 24. Each pair of I/O lines 26 is connected to a respective differential sense amplifier 30. As a result of the interleaving of digit lines D, D* in each section 12, each section may include digit lines D, D* that are coupled to two sets of sense amplifiers 20. Therefore, a defect in one of the sections 12 that affects adjacent rows may adversely affect digit lines D, D* that are coupled to two different sets of sense amplifiers 20. Also, a defect in a sense amplifiers 20 can adversely affect the ability to sense memory cells 14 in two different sections 12. Therefore, if the memory device has an open digit line architecture, two redundant sections may be provided to replace two main section or two redundant sections that are affected by a single defect.

In the embodiment shown in FIG. 1, each section 22, 24 contains 2,048 columns of memory cells and 512 rows of memory cells, although in other embodiments, each section of memory cells contains different numbers of rows and/or columns. However, the 2,048 columns are addressed in groups of 8 to simultaneously provide 8 bits of data for each column address. Therefore 8 pairs of I/O lines 26 and 8 differential sense amplifiers 30 are required to couple the sense amplifiers 20 between each section 22, 24.

Figure 2:
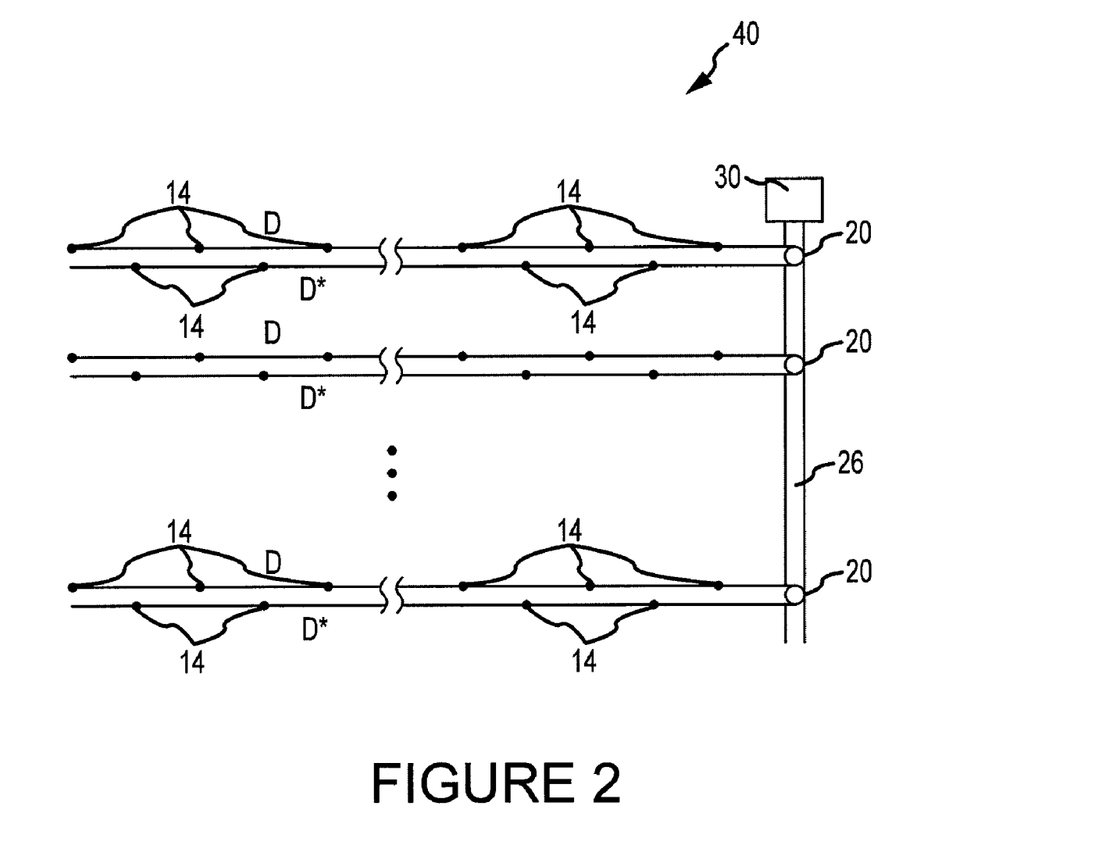
FIG. 2 is a schematic diagram of an embodiment of a section of memory cells according to another embodiment of the invention.

Another embodiment of a section 40 of memory cells 14 is shown in FIG. 2, in which the components that are common to components shown in FIG. 1 have been provided with the same reference numerals. The architecture shown in FIG. 2 is for a "folded-digit line" architecture in which each sense amplifier 20 is coupled to a digit line D and a complementary digit line D*, but the digit lines D, D* to which each sense amplifier 20 are connected extend through the same section 40, but in different columns. Again, all of the sense amplifiers 20 in each section are individually connected to a pair of complementary I/O lines 26, each of which is connected to a respective differential sense amplifier 30. The embodiment of the memory cell section 40 shown in FIG. 2 may also contain 2,048 columns of memory cells and 512 rows of memory cells, although, of course, other embodiments can contain different numbers of rows and/or columns. Again, the 2,048 columns may be addressed in groups of 8 so that 8 pairs of I/O lines 26 and 8 differential sense amplifiers 30 are used.

Figure 3:
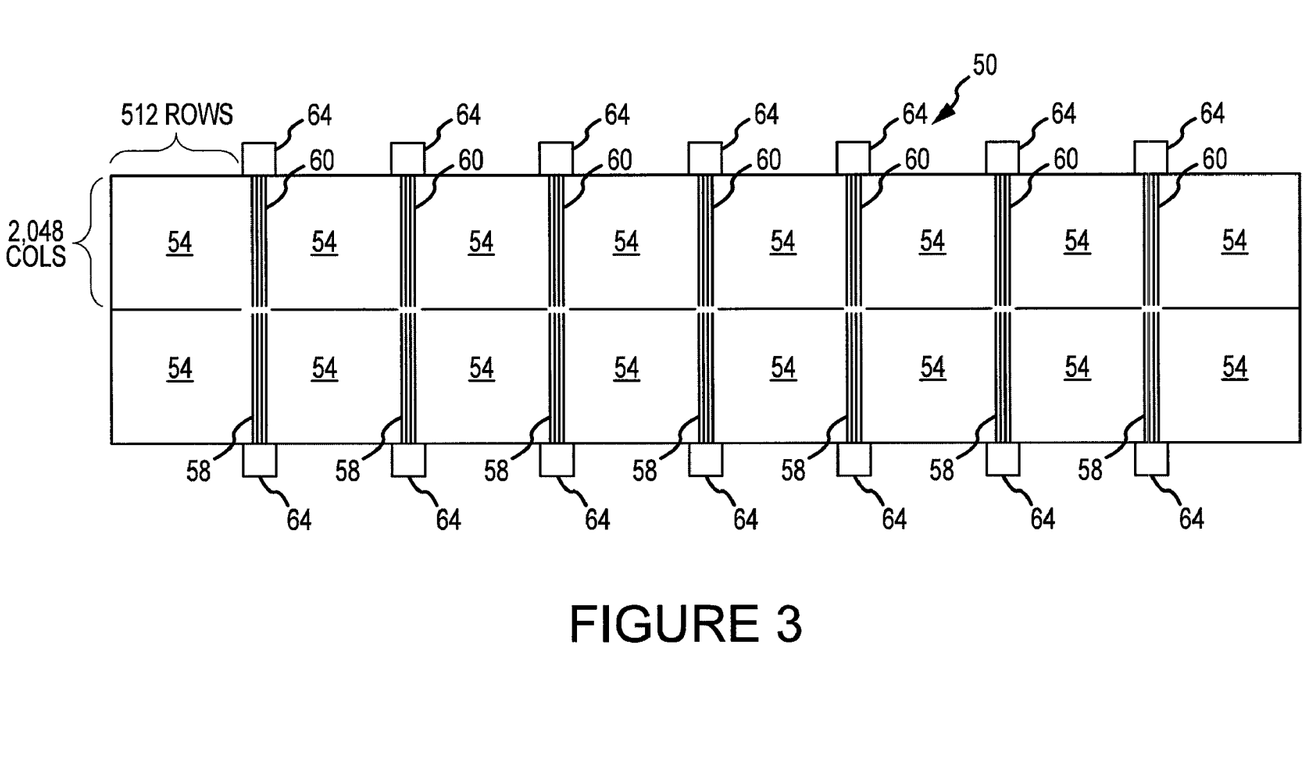
FIG. 3 is a schematic diagram of a memory device according to an embodiment of the invention.

An embodiment of a memory device 50 containing 16 sections 54 of memory cells is shown in FIG. 3. Each section 54 contains 512 rows of memory cells and 2,048 columns of memory cells, which are also addressed in groups of 8 columns. Each row line may extend through two adjacent sections 54 of memory cells in a folded digit line configuration, although other embodiments may use other configurations. The sense amplifiers 20 (FIGS. 1 and 2) between each pair of adjacent sections 54 may be fabricated in a gap 58 through which 8 pairs of differential I/O lines 60 extend. As shown in FIG. 3, the I/O lines 60 that are coupled to the upper sections 54 may extend upwardly to be coupled to respective differential sense amplifiers 64 fabricated adjacent the upper end of each gap 58, and the I/O lines 60 that are coupled to the lower sections 54 may extend downwardly to be coupled to respective differential sense amplifiers 64 fabricated adjacent the lower end of each gap 58. Each pair of I/O lines 60 may be connected to every eighth one of the sense amplifiers in each gap 58.

As explained in greater detail below, one of the sections 54 may be used as a redundant section of memory cells. In the event one or more pairs of I/O lines 60 or one or more of the differential sense amplifiers 64 is defective, the redundant section 54 can be substituted for the main section or redundant section serviced by the defective I/O lines 60 or differential sense amplifier 64. Although this technique may require that the memory device 50 include a large number of memory cells that will usually not be needed, relatively little circuitry may be required to support substituting the redundant section 54 for the defective section 54 because only the high order address bits corresponding to the defective section can be recorded and compared to received addresses.

Figure 4:
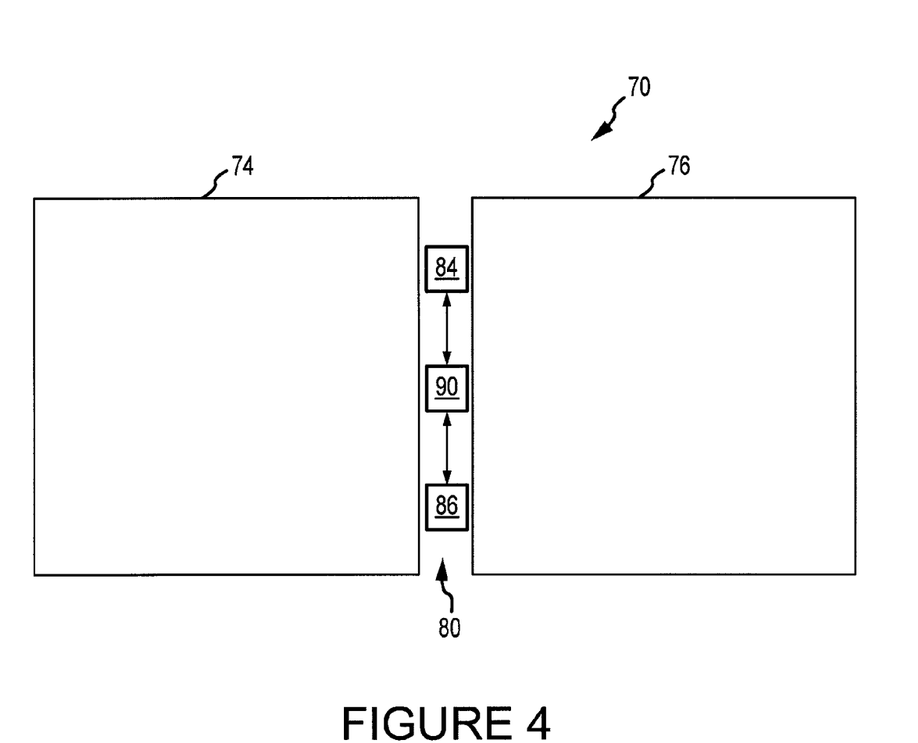
FIG. 4 is a schematic diagram of a memory device according to another embodiment of the invention.

A portion of a memory device 70 according to another embodiment of the invention is shown in FIG. 4. The memory device 70 includes two larger sections, such as banks 74, 76, each of which contains multiple smaller memory cell sections, such as blocks (not shown), with each block including rows and columns of memory cells coupled to sense amplifiers (not shown) through I/O lines. The banks 74, 76 are separated from each other by a gap 80 in which two redundant sections 84, 86 of memory cells and sense amplifiers are fabricated. However, other embodiments may include a fewer or greater number of redundant sections, and/or the redundant sections 84, 86 may be fabricated in other locations. The redundant sections 84, 86 are coupled to an addressing circuit 90, such as a row decoder and a column decoder. The addressing circuit 90 may also be fabricated in the gap 80, but in other embodiments it may be fabricated in other locations.

In operation, a bank and row address may be applied to the memory device 70 and coupled to the addressing circuit 90. The addressing circuit 90 may respond by accessing one of the rows in one of the main sections in one of the banks 74, 76 if the row and section corresponding to the address is not defective. If the row in the main section is defective, then the addressing circuit 90 may remap the address to the address of a redundant row of memory cells in the bank 74, 76 being accessed. If the main section identified by the address is defective, the addressing circuit 90 may remap the address to one of the redundant sections 84, 86 of memory cells. If a row in a redundant section is found to be defective, then the addressing circuit 90 may remap the access to the redundant row to a different redundant row of memory cells. In fact, the redundant row may be in the same redundant section as the defective row from which the access is mapped.

Figure 5:
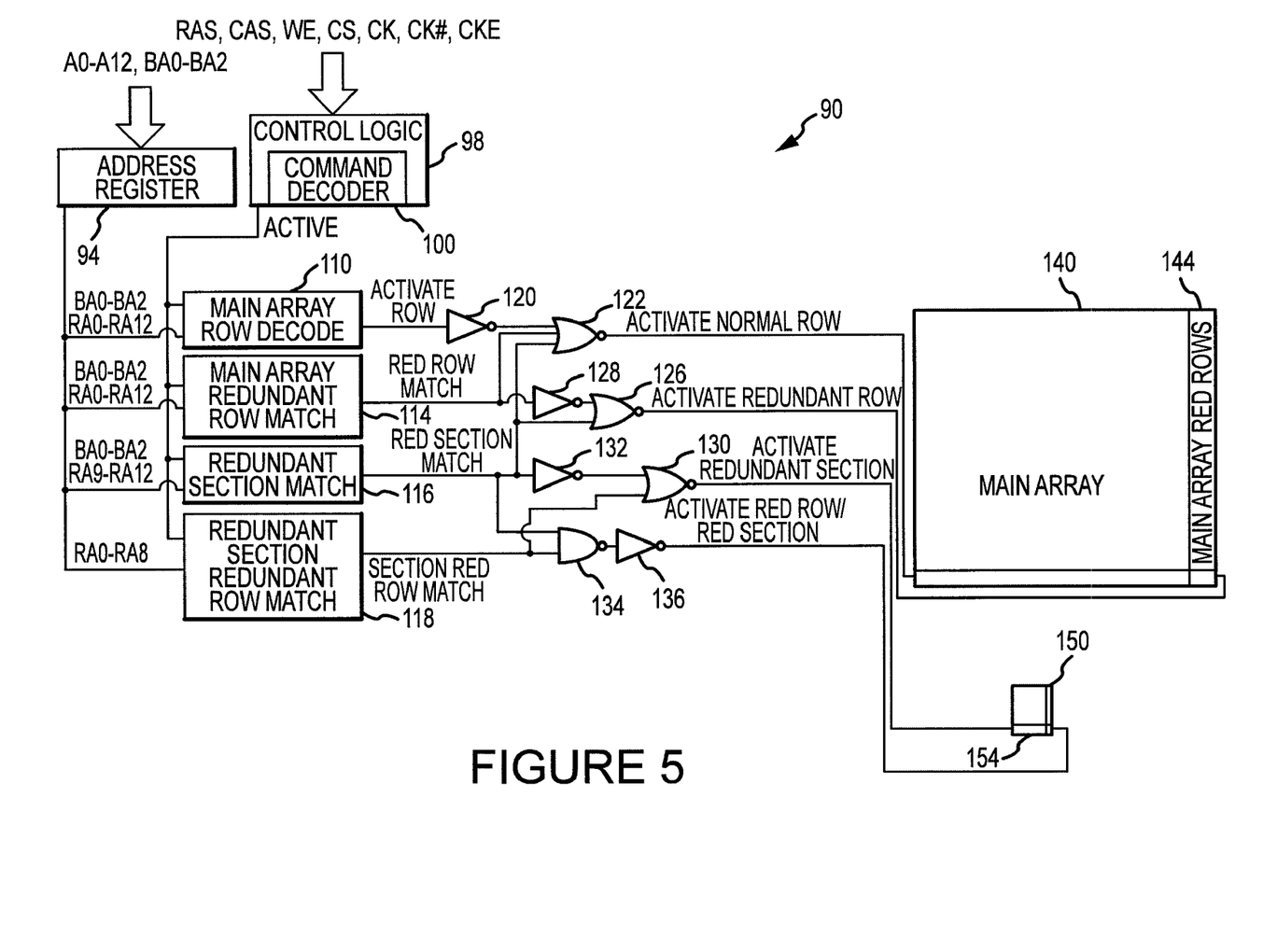
FIG. 5 is a block diagram of an addressing circuit that may be used in any of the memory devices of FIGS. 1-4 or in a memory device according to another embodiment of the invention.

An embodiment of the addressing circuit 90 is shown in FIG. 5. The addressing circuit 90 includes an address register 94 that receives and stores a 13-bit row address A0-A12 and a 3-bit bank address BA0-BA2. The addressing circuit 90 also includes control logic 98 including a command decoder 100 that receives memory commands, such as a row address strobe ("RAS") signal, a column address strobe ("CAS") signal, a write enable ("WE") signal, a chip select ("CS") signal, differential clock signals ("CK" and "CK#") and clock enable ("CKE") signal. The command decoder 100 generates an "ACTIVE" signal in response to a specific combination of these command signals. The command signals used by the control logic 98 are of the type typically received by a dynamic random access memory ("DRAM") device. However, other embodiments may use other types of command signals.

The addressing circuit 90 also includes a first row decoder, such as a main array row decoder 110, a first match circuit, such as a main array redundant match circuit 114, a second match circuit, such as a redundant section match circuit 116 and a third match circuit, such as a redundant section/redundant row match circuit 118, all of which are coupled to the address register 94. The main array row decoder 110 may receive the bank address BA0-BA2 and row address RA0-RA12 as well as the ACTIVE signal from the command decoder 100. In response to the ACTIVE signal, the decoder 110 may generate an active high ACTIVATE ROW signal. The ACTIVATE ROW signal may be applied through an inverter 120 to an input of a NOR gate 122.

The main array redundant match circuit 114 may also receive the bank address BA0-BA2, the row address RA0-

RA12 and the ACTIVE signal. The circuit 114 stores bank and row addresses corresponding to defective rows of memory cells, and compares the stored bank and row addresses to each received bank and row address, respectively. In the event of a match, which indicates an access is being made to a defective row, the redundant match circuit 114 may generate an active high RED ROW MATCH signal in response to the ACTIVE signal. The RED ROW MATCH signal may be applied to an input of the NOR gate 122 and to an input of a second NOR gate 126 through an inverter 128.

The redundant section match circuit 116 receives the bank address BA0-BA2, the 4 high order bits RA9-RA12 of the row address, and the ACTIVE signal. The redundant bank match circuit 116 stores bank addresses corresponding to defective banks of memory cells. In response to the ACTIVE signal, the match circuit 116 compares the stored bank addresses to each received bank address, and generates an active high RED SECTION MATCH signal in the event of a match. The RED SECTION MATCH signal may be applied to the third input of the NOR gate 122, to a third NOR gate 130 through an inverter 132 and to an input of a NAND gate 134.

The redundant section/redundant row circuit 118 receives only the 9 low order bits RA0-RA8 of the row address. The circuit 118 stores row addresses corresponding to defective rows of memory cells in the redundant section and compares those addresses to the received row address bits RA0-RA8. In event of a match, the redundant section/redundant row circuit 118 generates an active high SECTION RED ROW MATCH signal in response to the ACTIVE signal. The SECTION RED ROW MATCH signal may be applied to an input of the NOR gate 130 and to an input of the NAND gate 134. The output of the NAND gate 134 may be applied to an inverter 136.

In operation, the NOR gate 122 generates an active high ACTIVATE NORMAL ROW signal in the event all of its inputs are low. All of its inputs will be low if the main array row decoder 110 decodes a bank and row address corresponding to a bank and a row in the associated bank, if the main array redundant match circuit 114 does not detect that the addressed row is defective, and if the redundant section match circuit 116 does not detect that the addressed section is defective. If any of these conditions do not exist, the ACTIVATE NORMAL ROW signal will not be generated. The ACTIVE NORMAL ROW signal causes the addressed row of memory cells in an addressed array 140 of memory cells to be accessed, which can normally occur in most memory accesses.

The NOR gate 126 generates an active high ACTIVATE REDUNDANT ROW signal if all of its inputs are low, which will occur if the main array redundant match circuit 114 determines that a defective row is being addressed in the main array 140 and the redundant section match circuit 116 determines that the addressed section containing the redundant row is not defective. The ACTIVATE REDUNDANT ROW signal causes one of several redundant rows 144 in the main array 140 to be accessed because the addressed row in that section is defective.

The NOR gate 130 generates an active high ACTIVATE REDUNDANT SECTION signal if all of its inputs are low, which will occur if the if the redundant section match circuit 116 detects that the addressed section is defective and the redundant section/redundant row circuit 118 does not detect that the addressed row in the redundant section is defective. The ACTIVATE REDUNDANT SECTION signal then causes the addressed row to be accessed in a redundant section 150 of memory cells.

Finally, the inverter 136 generates an active high ACTIVATE RED ROW/RED SEC signal if all of its inputs are low, which will occur if the redundant section match circuit 116 determines that the addressed section is defective and the redundant section/redundant row circuit 118 detects that the addressed row in the redundant section is defective. In such case the ACTIVATE RED ROW/RED SEC signal causes one of several redundant rows 154 in the redundant section 150 to be accessed.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

We claim:

1. A memory device, comprising:
    a memory array comprising a plurality of main sections of memory cells;
    a plurality of digit lines in each main section, at least one digit line being provided for each row of memory cells in the main section, each of the digit lines being configured to be selectively coupled to the memory cells in a respective one of the rows;
    a plurality of sense amplifiers, each of the sense amplifiers being coupled to a respective pair of the digit lines;
    a plurality of sets of input/output lines, each of the input/output lines in each set being configured to be coupled to a respective plurality of the sense amplifiers;
    a redundant section of memory cells arranged in rows and columns, the number of memory cells in the redundant section corresponding in number to the number of memory cells in each of the main sections;
    a plurality of digit lines in the redundant section, at least one digit line being provided for each row of memory cells in the redundant section, each of the digit lines being configured to be selectively coupled to the memory cells in a respective row in the redundant section;
    a plurality of redundant sense amplifiers, each of is the redundant sense amplifiers being coupled to a respective digit line in the redundant section;
    a plurality of redundant input/output lines, each of the input/output lines being configured to be coupled to a respective plurality of the redundant sense amplifiers; and
    an addressing circuit coupled to the memory array and the redundant section, the addressing circuit being configured to receive an address and to compare the received address with a record of a section determined to be defective, the addressing circuit being configured in the event of a match to redirect an access to memory cells corresponding to the received address to memory cells in the redundant section.

2. The memory device of claim 1 wherein at least some of the main sections of memory cells further comprise a redundant row of memory cells, and wherein the addressing circuit is further configured to compare the received address with a record of defective rows of memory cells in each of the sections, the addressing circuit further being configured in the event of a match to redirect an access to memory cells in a row corresponding to the received address to the redundant row of memory cells.

3. The memory device of claim 2 wherein the redundant row of memory cells to which the access is redirected is in the same section as the memory cells in the row corresponding to the received address.

4. The memory device of claim 1 wherein the redundant section of memory cells further comprises a redundant row of memory cells that is configured to be selectively coupled to a digit line in the redundant section, and wherein the addressing circuit is further configured to compare an address corresponding to a row of memory cells in the redundant section to which the access is redirected to a record of defective rows of memory cells in the redundant section, the addressing circuit further being configured in the event of a match to redirect the access to the redundant row of memory cells in the redundant section.

5. The memory device of claim 1 wherein the plurality of sections of the memory array are fabricated on a semiconductor substrate and are separated from each other by respective gaps, and wherein the redundant section is fabricated in one of the gaps.

6. The memory device of claim 5 wherein the addressing circuit is fabricated in the same gap in which the redundant section is fabricated.

7. The memory device of claim 1 wherein the memory cells in the array comprise dynamic random access memory cells.

8. The memory device of claim 1, further comprising a plurality of sets of differential sense amplifiers, each of the differential sense amplifiers in each set being coupled to respective input/output lines in a respective set of input/output lines.

9. The memory device of claim 1 wherein the plurality of sections of the memory array are fabricated on a semiconductor substrate and are separated from each other by respective gaps, and wherein the input/output lines in each set extend through a respective one of the gaps.

10. The memory device of claim 1 wherein the sense amplifiers are configured to be selectively coupled to a respective plurality of the digit lines in two adjacent sections in a folded digit line configuration.

11. The memory device of claim 1 wherein the addressing circuit comprises:
a array decoder coupled to receive at least a portion of the received address and being configured to generate a row activate signal;
a first match circuit storing a record of defective rows of memory cells in the array, the first match circuit being configured to compare each address received by the array decoder with the record of defective rows of memory cells, and, in the event of a match to generate a first match signal; and
a first logic circuit coupled to receive the row activate signal and the first match signal, the first logic circuit being configured to generate a first activate signal to access a row of memory cells in the array corresponding to the received address responsive to receiving the row activate signal if the first match signal is not received, and to generate a second activate signal to access a redundant row of memory cells in the array responsive to receiving the row activate signal and the first match signal.

12. A memory device, comprising:
a main array having a plurality of main sections of memory cells, at least one of the plurality of main sections including at least one redundant row of memory cells;
a redundant section of memory cells; and
an addressing circuit coupled to the main array and the redundant section, the addressing circuit being configured to receive an address and to compare the received address with a record of defective sections in the main array, the addressing circuit being configured in the event of a match to redirect an access to memory cells in the main array corresponding to the received address to memory cells in the redundant section.

13. The memory device of claim 12 wherein the addressing circuit comprises:
a array decoder coupled to receive at least a portion of the received address and being configured to generate a row activate signal;
a first match circuit storing a record of defective rows of memory cells in the main array, the first match circuit being configured to compare each address received by the array decoder with the record of defective rows of memory cells, and, in the event of a match to generate a first match signal; and
a first logic circuit coupled to receive the row activate signal and the first match signal, the first logic circuit being configured to generate a first activate signal to access a row of memory cells in the main array corresponding to the received address responsive to receiving the row activate signal if the first match signal is not received, and to generate a second activate signal to access a redundant row of memory cells in the main array responsive to receiving the row activate signal and the first match signal.

14. The memory device of claim 13 wherein the addressing circuit further comprises:
a second match circuit storing a record of defective sections of memory cells in the main array, the second match circuit being configured to compare each address received by the array decoder with the record of defective sections of memory cells in the main array, and, in the event of a match to generate a second match signal; and
a second logic circuit coupled to receive the row activate signal and the second match signal, the second logic circuit being configured to generate a third activate signal to access a row of memory cells in the redundant section responsive to receiving the row activate signal and the second match signal.

15. The memory device of claim 12 wherein the addressing circuit comprises:
an array decoder coupled to receive at least a portion of the received address and being configured to generate a row activate signal;
a first match circuit storing a record of defective sections of memory cells in the array, the first match circuit being configured to compare each address received by the array decoder with the record of defective sections of memory cells, and, in the event of a match to generate a first match signal; and
a first logic circuit coupled to receive the row activate signal and the first match signal, the first logic circuit being configured to generate a first activate signal to access a row of memory cells in the array corresponding to the received address responsive to receiving the row activate signal if the first match signal is not received, and to generate a second activate signal to access a row of memory cells in the redundant section responsive to receiving the row activate signal and the first match signal.

16. The memory device of claim 15 wherein the addressing further circuit comprises:
a second match circuit storing a record of defective rows of memory cells in the redundant section, the second match circuit being configured to compare each address received by the first array decoder with the record of defective rows of memory cells in the redundant section, and, in the event of a match to generate a second match signal; and a second logic circuit coupled to receive the row activate signal, the first match signal, and the second match signal, the second logic circuit being configured to generate a third activate signal to access a redundant row of memory cells in the redundant section responsive to receiving the row activate signal, the first match signal and the second match signal.

17. The memory device of claim 12 wherein the plurality of sections of the memory array are fabricated on a semiconductor substrate and are separated from each other by respective gaps, and wherein the redundant section is fabricated in one of the gaps.

18. The memory device of claim 12 wherein the addressing circuit is further configured to compare the received address with a record of defective rows of memory cells in each of the main sections, the addressing circuit further being configured in the event of a match to redirect an access to memory cells in a row corresponding to the received address to the at least one redundant row of memory cells.

19. The memory device of claim 18 wherein the at least one redundant row of memory cells is in the same section as the memory cells in the row corresponding to the received address.

20. The memory device of claim 12 wherein the redundant section of memory cells further comprises a redundant row of memory cells, and wherein the addressing circuit is further configured to compare an address corresponding to the row of memory cells in the redundant section to which the access has been redirected with a record of defective rows of memory cells in the redundant section, the addressing circuit further being configured in the event of a match to further re-direct the access to a redundant row of memory cells in the redundant section.

21. The memory device of claim 12 wherein the plurality of sections of the main array are fabricated in a semiconductor substrate and are separated from each other by respective gaps, and wherein a set of input/output lines are coupled to at least one of the sections of memory cells adjacent the gap and extend through at least one of the gaps.

22. The memory device of claim 12 wherein the memory cells in the main array comprise dynamic random access memory cells.

23. A method of repairing memory cells in a main array containing a plurality of sections each of which includes a plurality of the memory cells, with the memory cells in each section being selectively coupled through a plurality of digit lines to a common set of input/output lines, the method comprising:

receiving a memory request associated with an address of a memory cell to be accessed;

determining if the address associated with the received request corresponds to a section of memory cells that has been determined to be defective;

if the address associated with the received request is not determined to correspond to a section of memory cells that has been determined to be defective, accessing the memory cell corresponding to the address; and if the address associated with the received request does correspond to a section of memory cells that has been determined to be defective, accessing a memory cell in the redundant section.

24. The method of claim 23, further comprising:

determining if the address associated with the received memory request corresponds to a row of memory cells that has been determined to be defective;

if the address is not determined to correspond to a row of memory cells that has been determined to be defective, accessing the row of memory cells corresponding to the address; and if the address is determined to correspond to a row of memory cells that has been determined to be defective, accessing a redundant row of memory cells in the section corresponding to the address.

25. The method of claim 23, further comprising:

determining if the memory cell being accessed in the redundant section is in a row corresponding to a redundant row address that has been recorded as corresponding to a defective row;

if the memory cell being accessed in the redundant section has not been determined to be in a row corresponding to a redundant row address that has been recorded as corresponding to a defective row, accessing the row of memory cells in the redundant section; and if the memory cell being accessed in the redundant section has been determined to be in a row corresponding to a redundant row address that has been recorded as corresponding to a defective row, accessing a redundant row of memory cells in the redundant section.

* * * * *

UNITED STATES PATENT AND TRADEMARK OFFICE
CERTIFICATE OF CORRECTION

PATENT NO. : 8,144,534 B2  
APPLICATION NO. : 12/547209  
DATED : March 27, 2012  
INVENTOR(S) : Aron Lunde et al.

Page 1 of 1

It is certified that error appears in the above-identified patent and that said Letters Patent is hereby corrected as shown below:

Title page, Item (57), under "Abstract", in column 2, line 2, delete "discloses," and insert -- disclosed, --, therefor.

In column 6, line 40, in Claim 1, delete "is the" and insert -- the --, therefor.

Signed and Sealed this  
Twenty-ninth Day of May, 2012

David J. Kappos  
*Director of the United States Patent and Trademark Office*